United States Patent [19]

Knemeyer et al.

[11] Patent Number: 5,270,077
[45] Date of Patent: Dec. 14, 1993

[54] METHOD FOR PRODUCING FLAT CVD DIAMOND FILM

[75] Inventors: Friedel S. Knemeyer, Granville; David E. Slutz, Columbus, both of Ohio

[73] Assignee: General Electric Company, Worthington, Ohio

[21] Appl. No.: 806,389

[22] Filed: Dec. 13, 1991

[51] Int. Cl.$^5$ .............................................. C23C 16/00
[52] U.S. Cl. .................................. 427/249; 427/255.1; 427/255.2
[58] Field of Search ............. 156/655; 427/249, 255.1, 427/255.2

[56] References Cited

U.S. PATENT DOCUMENTS

| | | | |
|---|---|---|---|
| 4,707,384 | 11/1987 | Schachner et al. | 427/255.2 X |
| 4,987,002 | 1/1991 | Sakamoto et al. | 427/249 X |
| 5,006,203 | 4/1991 | Purdes | 427/249 X |
| 5,114,745 | 5/1992 | Jones | 427/255.2 X |

FOREIGN PATENT DOCUMENTS

0422303A1 8/1991 European Pat. Off.
0523968A1 1/1993 European Pat. Off.

*Primary Examiner*—Thi Dang

[57] ABSTRACT

A chemical vapor deposition method for producing a flat diamond film substantially free of cracks by forming the diamond film on the surface of a substrate having a convex growth surface wherein the radius of curvature is matched with the tensile stress within the diamond coating produced to compensate for distortion when the film is separated from the substrate.

7 Claims, No Drawings

METHOD FOR PRODUCING FLAT CVD DIAMOND FILM

The present invention relates to a chemical vapor deposition method of preparing diamond films, more particularly to an improved method of preparing flat diamond films substantially free of cracks.

BACKGROUND OF THE INVENTION

Diamond possesses many desirable physical properties such as hardness, chemical inertness, infrared transparency, and excellent heat conductivity coupled with very high electrical resistivity. Consequently, diamond is a material with many important technological applications such as in optical devices, semiconductors, heat sinks, abrasives, tool coatings, etc. It can also be used as a high-grade, radiation resistant, high-temperature semiconductor. Thus, there is considerable incentive to find more practical ways to synthesize diamond, especially in film form, for these many and varied applications.

Various methods are known for the synthetic production of diamond in film form. One class of methods developed for synthetic diamond deposition is the low-pressure growth of diamond called the chemical vapor deposition (CVD) method. Three predominant CVD techniques have found favor in the literature.

One of these techniques involves the use of a dilute mixture of hydrocarbon gas, typically methane, and hydrogen whose hydrocarbon content usually varies from about 0.1% to 2.5% of the total volumetric flow. The gas is introduced via a quartz tube located just above a hot tungsten filament which is electrically heated to a temperature ranging from about 1750° C. to 2400° C. The gas mixture disassociates at the filament surface and diamonds are condensed onto a heated substrate placed just below the hot tungsten filament. The substrate, often molybdenum, is heated to a temperature in the region of about 500° C. to 1100° C.

The second technique involves the imposition of a plasma discharge to the foregoing filament process. The plasma discharge serves to increase the nucleation density, growth rate, and it is believed to enhance formation of diamond films as opposed to discrete diamond particles. Three basic plasma systems have been utilized. One is a microwave plasma system, the second is an RF (inductively or capacitively coupled) plasma system, and the third is a d.c. plasma system. The RF and microwave plasma systems utilize relatively complex and expensive equipment which usually requires complex tuning or matching networks to electrically couple electrical energy to the generated plasma. Additionally, the diamond growth rate offered by these two systems can be quite modest.

The third method in use is direct deposit from acetylene as a hydrocarbon-rich oxyacetylene flame. In this technique, conducted at atmospheric pressure, a specific part of the flame is played on a substrate on which diamonds may condense at rates as high as 100 microns/hr. or more. See Y. Matsui et al., Japan Journal of Applied Physics, Vol. 28, p. 178 (1989).

The diamond coatings grow in tension due to growth defects and the "intrinsic strain" therein is proportional to the coating thickness and also the rate of deposition. This intrinsic strain manifests itself by a bowing and/or cracking in the diamond film that has been released from a rigid substrate. The diamond film relieves the tensile stress which was within the diamond coating by bowing into a curved configuration or by cracking.

Substrates of molybdenum have been favored for producing thin diamond films because the CVD diamond tends to nucleate readily on this material. However, removal of a thick diamond film from a molybdenum substrate has posed problems due to strong carbide bonds which form and cause cracking on cooldown and/or require dissolution of the substrate to obtain a self-supporting film. The use of release agents can promote the eventual removal of the film from the substrate; however, once removed, the films still bow in response to this intrinsic strain.

There has been no satisfactory method yet developed to compensate for this bowing problem. Most of the bowing problems have been addressed by growing films with small surface areas so that the bow is not pronounced.

It is desirable to produce CVD diamond films which are flat, which are substantially crack-free, which are easily removed from the substrate upon which they are deposited, and which do not release prematurely during deposition.

OBJECTS OF THE INVENTION

It is an object of the invention to provide an improved method for preparing CVD diamond coatings on a rigid substrate, such that the resulting diamond film released from the growth substrate is flat and free of cracks.

Another object of the invention is to provide a convex substrate and a CVD reactor for preparing flat-crack-free diamond film, wherein the radius of curvature of the convex substrate shapes the diamond coating to compensate for the distortion which results from the release of the tensile stress within the CVD diamond coating.

It is yet another object of the invention to provide a flat CVD diamond film substantially free of cracks.

Upon further study of the specification and appended claims, further objects and advantages of this invention will become apparent to those skilled in the art.

SUMMARY OF THE INVENTION

This invention relates to an improved chemical vapor deposition method for producing a flat diamond film substantially free of cracks in which the surface of a heated substrate is contacted with an excited gaseous hydrogen and hydrocarbon mixture under conditions of pressure, temperature and gas concentration which promote the growth of a diamond coating, which provides a flat diamond film when removed from the substrate. In this process, the substrate has a convex growth surface with a radius of curvature matched with the tensile stress within the diamond coating produced so as to provide a flat, self-supported diamond film substantially free of cracks when the coating is separated from the substrate.

This invention also relates to a substrate for the growth of diamond coatings by chemical vapor deposition methods which has a convex growth surface. The radius of curvature of the convex growth surface is matched with the tensile stress within the diamond coatings produced thereon so as to provide a flat, self-supported diamond film when the coating is separated therefrom.

An apparatus for the deposition of diamond films is also provided which comprises a chemical vapor deposition (CVD) reactor having a substrate as described above positioned within the reaction chamber.

Also provided by this invention are flat CVD diamond films substantially free of cracks.

DETAILED DISCLOSURE

The diamond films of this invention are flat, i.e., these films bow less that about 100 μm from "peak to valley" and preferably less than 10 μ, and most preferably less than 3 μ over a distance of one inch, independent of direction. The "peak to valley" measurement is the distance from the imaginary plane that intersects the highest points on the concave surface of the film to the lowest point on the concave surface of the film.

The films of this invention have a thickness from about 1 to about 2,000 microns, preferably about 150 to about 1,000 microns. They can be produced in all sizes, e.g., with a surface area from about 0.1 square inch to 2,500 square inches. The films typically have a surface area of about one square inch to ten square inches.

The chemical vapor deposition (CVD) method of this invention produces such flat diamond films utilizing a substrate which has a convex growth surface. The radius of curvature of the convex growth surface is such that the resulting curvature of the diamond film deposited thereon compensates for the inherent tensile stress anticipated in the diamond film. By anticipating the inherent tensile stress in the diamond film formed and compensating for the distortion caused by the release of this stress, one can produce a flat diamond film which is free of cracks.

Surprisingly, it has been found that the distortion (bowing) that results upon release of the tensile stress in the diamond coating can be compensated for by growing the diamond coating on a convex growth surface such that, when the diamond coating is released from the substrate, the diamond coating will relieve the inherent tensile stress therein by bowing into a flat configuration without the formation of cracks or fragmentation. To accomplish this, it is necessary to anticipate the tensile stress which is inherent in the CVD diamond films to be grown on the substrate at the CVD conditions desired. The faster the diamond growth rate, the greater the tension within the film. Other growth conditions and process variables can affect the tensile stress in the film produced. The diamond coating is grown in a curved configuration on the substrate which is opposite to the direction of the stress-relieving deformation that results when released from the substrate. By matching the curvature of the substrate to the tensile stress created in a CVD diamond film as it grows, the stress-relieving deformation flattens the film when released from the substrate.

Conventional growth conditions on a conventional flat substrate produces films with a bow of about 150–190 μm from peak to valley over a distance of one inch where no cracks form. Utilizing a substrate with a radius of curvature that provides a bow of 50–250 μm from peak to valley over one inch, is a good first approximation of the extent of curvature needed. The tension within the diamond films formed will vary with the equipment and conditions utilized. An alternative first approximation for the conditions and equipment to be employed is to measure the bow in a film obtained on a flat substrate. Adjustments to the radius of curvature of the substrate can be made as needed.

The substrates utilized in this invention can be of a conventional thickness, width and length. They preferably are greater than ⅛" thickness, more preferably about ¼" thickness. Less cracking often results with thicker substrates. Although the substrates can generally be of any conventional length or width for CVD diamond substrates, they generally provide 1–10 square inches of surface area. A number of one-inch square substrates are often tied together in an array. A typical array is 8" wide and 9" long and comprises about forty-two 1-inch square substrates. The level of tensile stress within the films produced on an array can vary depending on the location of growth within the array. The substrates within the array may vary in curvature so that the "peak to valley" values vary by 10–100 μm.

The substrate may be comprised of any material conventionally used for CVD diamond deposition. These include materials selected from the class comprising silicon carbide, tungsten carbide, molybdenum, boron, boron nitride, niobium, graphite, copper, aluminum nitride, silver, iron, nickel, silicon, alumina and silica, as well as combinations thereof. Molybdenum is one of the preferred substrate materials because it generates a high density of diamond nuclei without having been roughened or subjected to abrasion with diamond dust. In addition, the thermal expansion coefficient of molybdenum, i.e., $\alpha = 5.1 \times 10^{-6}/°$ C., is relatively constant with temperatures above 152° C., its Debye temperature, and is higher than the thermal expansion coefficient of diamond, i.e., $\alpha = 1.5 \times 10^{-6}/°$ C. at 124° C. and $4.8 \times 10^{-6}/°$ C. at 930° C. The thermal expansion coefficient of diamond rapidly changes in the temperature range of CVD diamond growth since its Debye temperature is far above that temperature. Niobium is also preferred because diamond films release more easily from the substrate.

Because the thermal expansion coefficient of molybdenum between the substrate deposition temperature and room temperature is 30% larger than the average thermal expansion coefficient of diamond film, the diamond film is placed under compression as the substrate is cooled after deposition is finished. This compressive stress in the diamond film and the tensile stress in the substrate is at first accommodated by elastic strain in the diamond film and the substrate. This elastic strain energy is released when the connection between the molybdenum and the diamond is severed and the film removed. If the stored elastic energy is too great, the diamond film may crack or fracture into a large number of small pieces of diamond by a catastrophic separation from the substrate. The convex growing surface does not significantly add to the strain within the diamond film, which allows flat diamond films without cracks to be obtained.

Preferably, the diamond films lift off the substrate(s) on cool-down. Where this does not occur, the substrate is typically etched away with acid to recover the film.

The apparatus of this invention comprises a conventional reaction chamber which is air tight and capable of maintaining a reduced pressure. It is fitted with at least one gas inlet for the reactant hydrocarbon and hydrogen gas mixture and an exhaust means (port). All portions of the apparatus which are present in the reaction chamber are constructed of suitable heat-resistant material as necessary to withstand filament temperatures on the order of about 2,000° C. and substrate temperatures up to about 1,100° C. Quartz is an illustrative non-conductive heat-resistant material suitable for this purpose.

The apparatus includes a means for heating the substrate growth surface from 500°–1,100° C., which preferably comprises one or more electrically conducting filaments or wires, hereinafter generically designated "filaments," of conventional design and circuitry. The material of which said filaments are comprised is not critical; any material known in the art as suitable for this purpose is acceptable. Illustrative materials are metallic tungsten, tantalum, molybdenum and rhenium; because of its relatively low cost and particular suitability, tungsten is often preferred. Filament diameters of about 0.2-1.0 mm are typical, with about 0.3 mm frequently being preferred.

The filaments are preferably located parallel to the substrate. Distances from the filaments to the substrate are generally on the order of 5-10 mm. Since one or a plurality of filaments and associated structures are present, reference thereto hereinafter will be to only one; it should be understood that the total number thereof is not critical to the invention.

The apparatus also includes a means for exciting the reactant hydrocarbon and hydrogen gas mixture which enters the reaction chamber and a means for contacting the substrate with this excited gas mixture. The filaments described above can serve to excite the reactant gas mixture, which is directed over the substrate from the gas inlet. The means for contacting the substrate with the excited gas mixture need not comprise any additional elements if the substrate is positioned appropriately in the path of the gas mixture entering the reactor through the gas inlet(s).

The growth surface of the substrate used is convex having a radius of curvature in an amount corresponding to the inherent tensile stress which is contemplated in the diamond film to be produced.

In growing diamond coatings, conventional starting materials and process conditions are suitable. For example, hydrocarbon sources can include alkane series gases, for example, methane, ethane, propane; unsaturated hydrocarbons, for example, ethylene, acetylene, cyclohexene; and aromatics, e.g., benzene; and the like. Methane, however, is preferred. The molar ratio of hydrocarbon to hydrogen broadly ranges from about 1:10 to about 1:1,000 and about 1:100 to 3:100 being preferred. This gaseous mixture optionally may be diluted with an inert gas such as argon.

The hot filaments are typically heated to a temperature between 1,750° C. and 2,400° C. Growth rates in the range of about 0.1 to 10 microns per hour have been easily obtained at energy requirements of only about 650 watts per hour. Growth rates greater than 10 microns per hour can be used at higher energy costs.

The substrate temperature utilized for diamond growth typically ranges from about 500° C. to 1,100° C., and is preferably in the range of 850° C. to 950° C. It is highly desirable to maintain the substrate at temperatures in the range of about 900° -1,000° C., since within this range minimum reaction occurs between the hydrogen present in the gas mixture and the elemental carbon produced from the hydrocarbon therein. Thus, the elemental carbon remains available to deposit as diamond at a high growth rate on the substrate. Absent any provisions for independently controlling substrate temperature, the reactor temperature frequently exceeds 1,000° C. and the diamond growth rate decreases substantially. Pressures for the gaseous admixture generally range from about 0.01 to 1000 Torr, advantageously about 1 to 800 Torr, and are typically on the order of 10 Torr. Details on conventional process conditions suitable for use herein can also be found in Angus et al., "Low Pressure Metastable Growth of Diamond and Diamond-Like Phases," *Science*. Vol. 241, pp. 913-921 (Aug. 19, 1988); and Bachman et al., "Thin Diamond Films," *Chemical Engineering News*, pp. 24-39 (May 15, 1989). U.S. Pat. No. 4,707,384 provides further details of conventional CVD conditions and techniques suitable for use herein.

Without further elaboration, it is believed that one skilled in the art can, using the preceding description, utilize the present invention to its fullest extent. The following preferred specific embodiments are, therefore, to be construed as merely illustrative, and not limitative of the remainder of the disclosure in any way whatsoever.

In the foregoing and in the following examples, all temperatures are set forth uncorrected in degrees Celsius and unless otherwise indicated, all parts and percentages are by weight.

The entire disclosure of all applications, patents and publications, cited above and below, are hereby incorporated by reference.

EXAMPLE

Two diamond films were made using a conventional CVD reactor as described hereinbefore and a flat (less than 3 $\mu$m bow over 1 inch), polished molybdenum substrate with a surface area of about 3 cm$^2$. A gas containing about 1-2% methane in hydrogen at about 0.1 bar was passed over a tungsten wire resistance-heated to bright white heat. After a few days, the hydrocarbon feed was stopped and the system cooled. The films were then removed from the substrate. Both films had a bow of 150-190 $\mu$m across one inch.

If this same reactor using the same conditions as above, a molybdenum substrate having a convex growth surface bowed with a radius of curvature of 200 $\mu$ from peak to valley over one inch is used to provide flat diamond films which bow with a radius of curvature less than 100 $\mu$m.

The preceding examples can be repeated with similar success by substituting the generically or specifically described reactants and/or operating conditions of this invention for those used in the preceding examples.

From the foregoing description, one skilled in the art can easily ascertain the essential characteristics of this invention, and without departing from the spirit and scope thereof, can make various changes and modifications of the invention to adapt it to various usages and conditions.

What is claimed is:

1. A method for producing a flat diamond film which comprises contacting a heated substrate with an excited gaseous hydrogen and hydrocarbon mixture under conditions of pressure, temperature and gas concentration which promote the growth of a diamond coating on a convex growth surface of said substrate, wherein the radius of curvature of the convex growth surface is matched with the tensile stress within the diamond coating formed, and separating the diamond coating from the convex growth surface of the substrate to provide a flat diamond film.

2. A method according to claim 1, wherein the convex growth surface of the substrate has a radius of curvature in the range of 50-250 $\mu$m from peak to valley across 1 inch in any direction.

3. A method according to claim 1, wherein the substrate is molybdenum.

4. A method according to claim 1, wherein the diamond film provided is substantially crack-free and has a thickness within the range of 1 to 2,000 μm.

5. A method according to claim 1, wherein the substrate is within an array of substrates having a convex growth surface, wherein the radius of curvature for the convex growth surfaces of the substrates varies across the array.

6. A method according to claim 1, which provides flat films having a radius of curvature of less than 100 μm from peak to valley over one inch in any direction.

7. A method according to claim 1, wherein the radius of curvature of the convex growth surface is about ®μ peak to valley over one inch in any direction.

* * * * *